United States Patent
Takayama et al.

(10) Patent No.: US 7,729,401 B2
(45) Date of Patent: Jun. 1, 2010

(54) SEMICONDUCTOR LASER DEVICE AND FABRICATION METHOD FOR THE SAME

(75) Inventors: Toru Takayama, Nara (JP); Tomoya Sato, Osaka (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 203 days.

(21) Appl. No.: 12/167,559

(22) Filed: Jul. 3, 2008

(65) Prior Publication Data

US 2009/0034573 A1 Feb. 5, 2009

(30) Foreign Application Priority Data

Jul. 30, 2007 (JP) .............................. 2007-197119

(51) Int. Cl.
*H01S 5/00* (2006.01)
(52) U.S. Cl. ................................. 372/49.01; 372/46.01
(58) Field of Classification Search .............. 372/49.01, 372/50.124, 46.01; 385/37, 126
See application file for complete search history.

(56) References Cited

U.S. PATENT DOCUMENTS

| | | | |
|---|---|---|---|
| 6,238,943 B1 * | 5/2001 | Kobayashi et al. ............ 438/31 |
| 6,600,764 B1 * | 7/2003 | Garbuzov et al. ........ 372/46.01 |
| 6,807,213 B1 | 10/2004 | Shimoyama et al. |
| 7,167,489 B2 | 1/2007 | Kawakami et al. |
| 7,184,625 B2 * | 2/2007 | Gunn et al. .................... 385/37 |
| 2002/0037021 A1 * | 3/2002 | Ohkubo ....................... 372/46 |
| 2002/0140467 A1 * | 10/2002 | Naffziger et al. ............ 327/113 |

FOREIGN PATENT DOCUMENTS

JP 2004-200507 7/2004

* cited by examiner

*Primary Examiner*—Minsun Harvey
*Assistant Examiner*—Tuan N. Nguyen
(74) *Attorney, Agent, or Firm*—McDermott Will & Emery LLP

(57) ABSTRACT

The semiconductor laser device includes a cavity structure having a first clad layer, an active layer and a second clad layer formed on a substrate. The second clad layer has a stripe portion extending between the front end face from which laser light is extracted and the rear end face opposite to the front end face. The stripe portion has a first region located closer to the front end face, a second region located closer to the rear end face and a change region whose width changes located between the first and second regions. The effective refractive index difference between the inside and outside of the stripe portion in the change region is greater than that in the first region.

11 Claims, 12 Drawing Sheets

… (1)

SEMICONDUCTOR LASER DEVICE AND FABRICATION METHOD FOR THE SAME

CROSS-REFERENCE TO RELATED APPLICATIONS

This application claims priority under 35 U.S.C. §119 on Patent Application No. 2007-197119 filed in Japan on Jul. 30, 2007, the entire contents of which are hereby incorporated by reference.

BACKGROUND OF THE INVENTION

1. Technical Field

The present invention relates to a semiconductor laser device and a fabrication method for the same, and more particularly to red and infrared semiconductor laser devices and fabrication methods for the same 2. Background Art In these days, demands for a light source for a high-speed writable optical disk system, such as a recording 16x DVD having not only playback function but also recording function, have increasingly grown. For such a light source, required is a semiconductor laser device having at least 300 mW high-output operation capability.

In general, in high-output operation of a semiconductor laser device, the cavity end face from which laser light is extracted (front end face) is coated with a dielectric film having a low reflectance of 10% or less, and the cavity end face opposite to the front end face (rear end face) is coated with a dielectric film having a high reflectance of 85% or more. With such antireflection (AR) coating and high reflection (HR) coating, the external differential quantum efficiency (slope efficiency) in the current-light output characteristic can be improved. This permits high light output with a small current amount injected. Also, the power density of laser light at the front end face is reduced, and this can prevent occurrence of a catastrophic optical damage (COD) in which the laser end face is melted down with the light output of the laser light itself.

Having a low front-face reflectance and a high rear-face reflectance is effective in improvement of the COD level and the light extraction efficiency. However, if the reflectance of the front end face is too low, the laser light fed back inside the cavity is reduced, causing increase in oscillation threshold current. Also, with the reflectance of the front end face being low, when the semiconductor laser device is applied to an optical disk, noise is likely to occur due to return light reflected from the optical disk (return light-induced noise). In view of the above, in a high-output laser, the front end face is coated so as to have a reflectance of about 5 to 10% to ensure attainment of high light extraction efficiency and also reduction in return light-induced noise. The rear end face is generally coated so as to have a reflectance of about 95 to 100% to ensure as high reflectance as possible.

In a high-output semiconductor laser device, in which the reflectance is largely different between the front and rear end faces, light propagating in the active layer in the cavity direction exhibits asymmetric light distribution intensity: the light distribution intensity is higher on the front end face side than on the rear end face side. In this situation, more intense stimulated emission occurs on the front end face side high in light distribution intensity than on the rear end face side. Accordingly, on the front end face side, a larger number of electron-hole pairs must be injected in the active layer than on the rear end face side. This is likely to cause shortage of electron-hole pairs in the active layer on the front end face side especially during high-output operation. Such shortage of electron-hole pairs may become a cause of saturation of the luminous efficiency. In attainment of a high-output laser having an output of 200 mW to 300 mW or more, this may degrade the temperature characteristic resulting in serious obstruction.

A normal AlGaInP semiconductor laser widely adopts a GaAs substrate using a plane tilted from (100) plane by 7° to 15° in [011] direction as the principal plane, to obtain a good temperature characteristic. In formation of a cavity on such a substrate, if only chemical wet etching is employed to form a ridge stripe portion, the acute angles formed between the crystal plane and the sidewalls of the stripe portion will be θ1=54.7°−θ°, θ2=54.7°+θ°. If the ridge stripe portion is formed by a physical method such as ion beam etching, the cross-sectional shape of the stripe portion can be axis-symmetric with respect to the axis in the layered direction in the crystal cross section. In this case, however, physical damage may be left behind on the ridge sidewalls, causing a leak at the interface between the ridge sidewalls and a current narrowing layer and thus deteriorating the current narrowing effect. For this reason, when a physical method is employed to form the stripe portion, also, it is desired to wet-etch the sidewalls of the ridge a little before growth of the current narrowing layer. Therefore, in this case, also, the shape of the stripe portion is axis-asymmetric.

In an axis-asymmetric stripe portion, the distribution of light propagating in a waveguide is asymmetric with respect to the stripe. In a high light density portion, radiation recombination of carriers often occurs under stimulated emission. Hence, the shape of spatial hole burning of carriers also exhibits asymmetric distribution. This indicates that the effective refractive index distribution in the horizontal direction parallel to the active layer is laterally asymmetric. As a result, the light distribution is likely to move in a direction in which the gain becomes relatively higher, and this is likely to cause a kink that is a bend formed in the light output-current characteristic.

To suppress occurrence of a kink, the stripe may be narrowed to allow the current flow to be concentrated in the narrow stripe region. This makes it possible to reduce the size of a depression in the carrier distribution generated due to spatial hole burning of operating carriers in the active layer, and thus suppress occurrence of a kink in the light output-current characteristic until reaching a higher output. However, a narrowed stripe causes increase in operating voltage along with increase in element serial resistance, as well as degradation in temperature characteristic along with increase in power consumption.

To solve the above problem, proposed is a semiconductor laser device that is formed on a compound semiconductor substrate tilted from (001) plane in [110] direction and has a stripe portion as shown in FIG. 13 (see Japanese Laid-Open Patent Publication No. 2004-200507, for example).

As shown in FIG. 13, a stripe portion 200 includes a first region 200a having a fixed width located in the center of the cavity and second regions 200b having a gradually widened width located on both sides of the first region. A current block layer (not shown) is provided on the sidewalls of the stripe portion 200, and the refractive index of the current block layer is smaller than that of the stripe portion 200.

With the above configuration, the effective refractive index inside the stripe portion 200 is higher than that outside the stripe portion 200. The light distribution is therefore confined inside the stripe portion 200 to permit fundamental transverse mode oscillation. Also, since the current block layer is transparent to laser light, the waveguide loss can be reduced, permitting reduction in operating current value. Moreover, in the first region 200a in which the width of the stripe portion 200 is fixed, the relative luminous position of the light distribution with respect to the shape of the stripe portion is fixed, and this stabilizes the optical axis of a far-field pattern (FFP) of the laser. In the second regions 200b in which the width of the stripe portion changes, the series resistance (Rs) can be reduced because the top of the stripe portion is widened. As a result, in the semiconductor laser device, while fundamental transverse mode oscillation stable in the light axis of FFP is attained, the operating current value and also Rs can be reduced.

However, the conventional semiconductor laser device described above has the following problem. For future implementation of a high-output laser permitting an output of 300 mW or more during high-temperature operation, the temperature characteristic must be improved, and for this purpose, the cavity length must be as large as about 1500 µm or more. The external differential quantum efficiency in the light output-current characteristic is proportional to mirror loss/(mirror loss+waveguide loss). The magnitude of the mirror loss is inversely proportional to the cavity length. Accordingly, as the cavity is longer, the mirror loss is smaller, and thus the external differential quantum efficiency is more susceptible to the waveguide loss. In a semiconductor laser device having 7%-reflectance coating on the front end face and 95%-reflectance coating on the rear end face, the mirror loss will be 15.1 $cm^{-1}$ if the cavity length is 900 µm and 9 $cm^{-1}$ if the cavity length is 1500 µm. The waveguide loss of a normal high-output laser is 10 $cm^{-1}$ or less. It has been clarified that the waveguide loss is more influential on the external differential quantum efficiency as the cavity length is larger. Light lost in the waveguide loss is converted to heat. Accordingly, the element heating is accelerated during high-temperature, high-output operation, causing degradation in heat saturation level.

In consideration of the above, in a semiconductor laser having a long cavity exceeding 1500 µm, reduction in waveguide loss is very important in improving the light output level at which heat saturation occurs at high temperature. For this reason, in a long cavity laser, the waveguide loss must be made as small as possible for improvement of the light output causing heat saturation.

The conventional semiconductor laser device described above has the first region small in stripe width and the second regions gradually changing in stripe width, for improvement of the kink level. Propagating light scatters from the ridge sidewalls of the second regions changing in stripe width, causing radiation loss. With such radiation loss, the waveguide loss increases by about several $cm^{-1}$, causing a problem of reduction in external differential quantum efficiency by about 10%.

SUMMARY OF THE INVENTION

An object of the present invention is providing a semiconductor laser device that is small in decrease of the external differential quantum efficiency, is less likely to cause saturation of the luminous efficiency in the high-output operation state and permits stable fundamental transverse mode oscillation.

To attain the above object, a semiconductor laser device of the present invention is provided with a stripe portion having a region changing in stripe width. The effective refractive index difference between the inside and outside of the stripe portion is greater in the stripe region changing in stripe width than in regions near the end faces.

Specifically, the semiconductor laser device of the present invention includes: a cavity structure including a first clad layer, an active layer and a second clad layer sequentially formed on a substrate, wherein the second clad layer has a stripe portion extending between a front end face from which laser light is extracted and a rear end face opposite to the front end face, the stripe portion has a first region located closer to the front end face, a second region located closer to the rear end face and a change region whose stripe width changes located between the first region and the second region, and the effective refractive index difference between the inside and outside of the stripe portion in the change region is greater than the effective refractive index difference between the inside and outside of the stripe portion in the first region.

In the semiconductor laser device of the present invention, horizontal light confinement in the change region whose stripe width changes can be intensified. Hence, the radiation loss of light propagating in the change region can be reduced, permitting suppression of increase in waveguide loss. Also, since the light confinement is weak near the front end face causing decrease in light density in the region near the front end face, the front end face is less likely to be melted down. Moreover, in the narrow stripe portion, spatial hole burning of carriers in the active layer can be suppressed, and thus the light output at which a kink occurs can be increased. As a result, it is possible to implement a semiconductor laser that is high in kink level, high in the light output at which meltdown occurs and stable in fundamental transverse mode.

The fabrication method for a semiconductor laser device of the present invention includes the steps of: (a) sequentially forming a first clad layer, an active layer and a second clad layer on a substrate; (b) forming a stripe portion having a change region whose stripe width changes by etching the second clad layer; and (c) forming a first current block layer so as to cover a region other than the change region and a second current block layer so as to cover the change region, wherein in the step (c), the first current block layer and the second current block layer are formed so that the effective refractive index difference between the inside and outside of the stripe portion in the change region is greater than the effective refractive index difference between the inside and outside of the stripe portion in the region other than the change region.

In the fabrication method for a semiconductor laser device of the present invention, a semiconductor laser device small in the radiation loss of light propagating in the change region to thereby permit suppression of increase in waveguide loss can be easily implemented.

DESCRIPTION OF THE PREFERRED EMBODIMENTS

Figure 1:
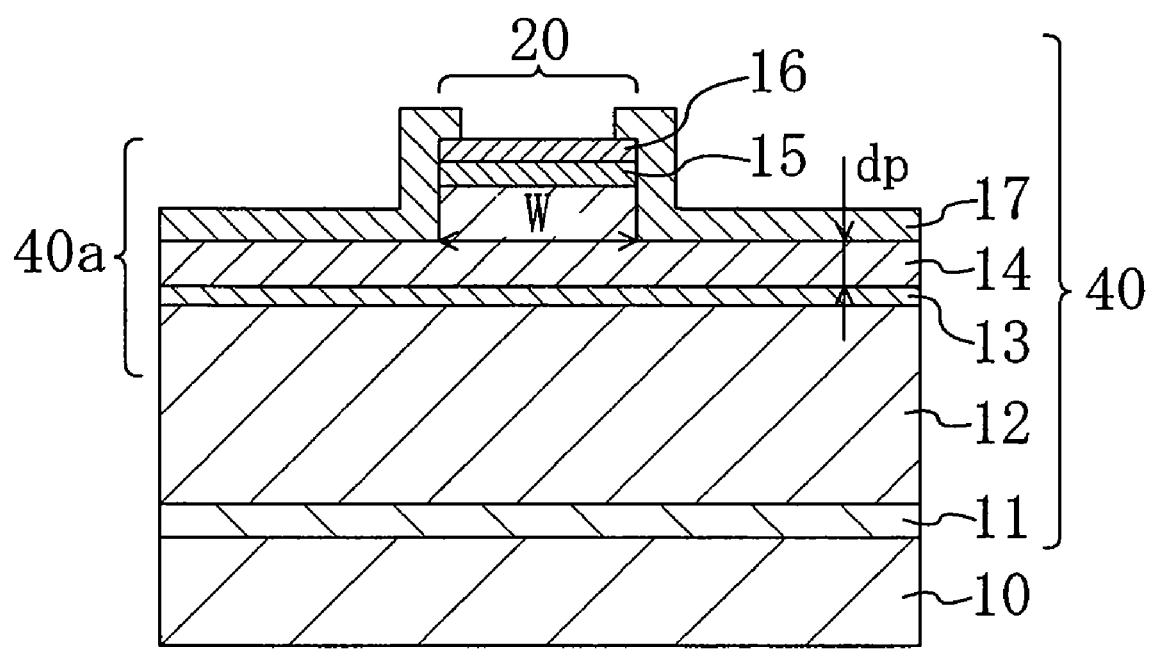
FIG. 1 is a cross-sectional view of a semiconductor laser device of an embodiment of the present invention.

Hereinafter, an embodiment of the present invention will be described with reference to the accompanying drawings. FIG. 1 is a cross-sectional view of a semiconductor laser device of this embodiment, which shows the cross-sectional configuration in a portion thereof closer to the front end face from which laser light is extracted. As shown in FIG. 1, the semiconductor laser device of this embodiment is a red laser device including a cavity structure 40 formed on a substrate 10 made of n-type GaAs having a plane tilted from (100) plane by 10° in [011] direction as the principal plane. Note that a P electrode and an N electrode are omitted in FIG. 1.

On the substrate 10, formed sequentially are a buffer layer 11 made of n-type GaAs having a thickness of 0.5 μm, a first clad layer 12 made of n-type $(Al_{0.7}Ga_{0.3})_{0.51}In_{0.49}P$ having a thickness of 2 μm, an active layer 13, a second clad layer 14 made of p-type $(Al_{0.7}Ga_{0.3})_{0.51}In_{0.49}P$, a protection layer 15 made of p-type $Ga_{0.51}In_{0.49}P$ having a thickness of 50 nm and a contact layer 16 made of p-type GaAs having a thickness of 0.4 μm.

The active layer 13, which is a distorted quantum well active layer, includes a first guide layer made of $(Al_{0.5}Ga_{0.5})_{0.51}In_{0.49}P$, three well layers made of GaInP, two barrier layers made of AlGaInP and a second guide layer made of AlGaInP.

The second clad layer 14 has a ridge stripe portion 20. The distance dp from the bottom of the stripe portion 20 to the top of the active layer 13 is 0.2 μm, and the distance from the top of the stripe portion 20 to the top of the active layer 13 is 1.4 μm. A current block layer 17 having a thickness of 0.3 μm is formed on each sidewall of the stripe portion 20.

The current block layer 17 includes a first current block layer formed near each end face and a second current block layer formed in the center, as will be described later.

A current injected via the contact layer 16 is narrowed into only the stripe portion 20 by the current block layer 17, to be concentrated in the portion of the active layer 13 located under the stripe portion 20. Hence, the inverted distribution state of carriers required for laser oscillation is attainable with an injected current as small as several tens of mA.

Light radiated in the direction vertical to the active layer 13, among light emitted under recombination of carriers injected into the active layer 13, is confined vertically by the first and second clad layers 12 and 14 sandwiching the active layer 13. Light radiated in the direction horizontal to the active layer 13 is confined horizontally by the difference in refractive index between the current block layer 17 and the second clad layer 14. The current block layer 17, transparent to laser oscillated light, does not absorb light, and thus a low-loss waveguide can be attained. Also, since the light distribution propagating in the waveguide is allowed to largely seep into the current block layer 17, an effective refractive index difference (Δn) of the order of $10^{-3}$ suitable for high-output operation can be easily attained. The magnitude of Δn can be precisely controlled in the order of $10^{-3}$ by changing dp. Thus, while controlling the light distribution precisely, it is possible to implement a high-output semiconductor laser low in operating current.

The effective refractive index difference (Δn) refers to the difference between Neq1 and Neq2 (Δn=Neq1−Neq2) where Neq1 is the ratio of the propagation constant (β1) in the vertical direction, i.e., normal to the substrate, of a multilayer waveguide configured vertically in the region inside the stripe portion to the wave number (k0) in the vacuum (β1/k0), and Neq2 is the ratio of the propagation constant (β2) in the vertical direction of a multilayer waveguide configured vertically in a region outside the stripe portion to the wave number (k0) in the vacuum (β2/k0).

In this embodiment, also, the cavity length is set at 1750 μm for improvement of heat radiation during high-temperature operation at 80° C.

The front and rear end faces of the cavity structure 40 are coated with a dielectric film (not shown) so that the reflectances against red laser light are 7% and 95%, respectively. Part of the contact layer 16, the protection layer 15, the second clad layer 14, the active layer 13 and the first clad layer 12 are disorganized near the front and rear end faces, forming end face windows 40a.

Figure 2:
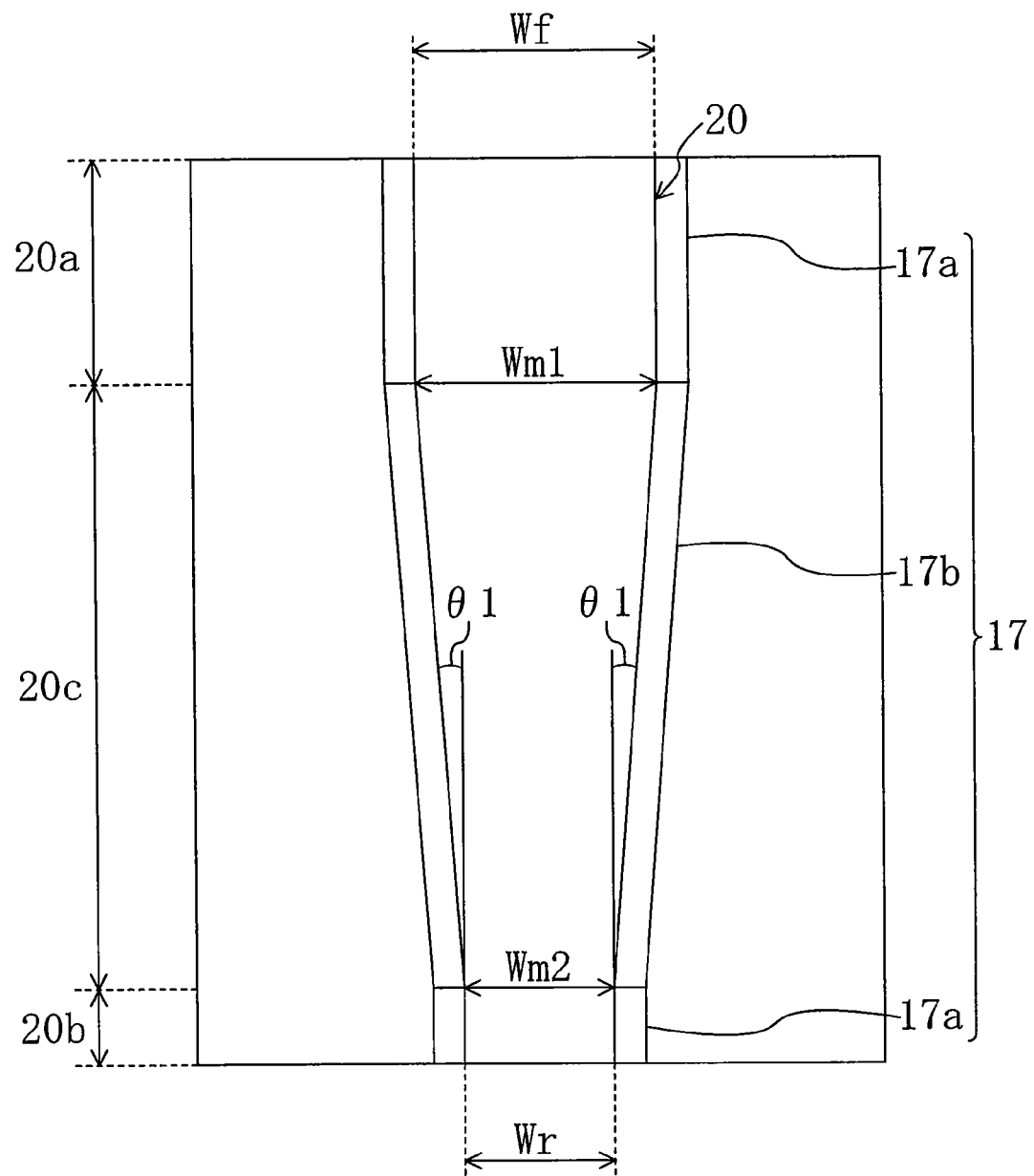
FIG. 2 is a plan view of the semiconductor laser device of the embodiment of the present invention.

FIG. 2 shows a plan configuration of the semiconductor laser device of this embodiment. As shown in FIG. 2, the stripe portion 20 has a first region 20a located closer to the front end face from which laser light is extracted, a second region 20b located closer to the rear end face opposite to the front end face, and a change region 20c located between the first region 20a and the second region 20b.

The stripe width Wf of the first region 20a is 3.5 μm, and the stripe width Wr of the second region 20b is 2.1 μm. In the change region 20c, the stripe width changes linearly from Wm1 to Wm2 with a taper angle of θ1. The stripe width as used herein refers to the width W of the bottom of the stripe portion 20 shown in FIG. 1.

A first current block layer 17a is formed on the sidewalls of the first and second regions 20a and 20b, and a second current block layer 17b is formed on the sidewalls of the change region 20c. The details of the first and second block layers 17a and 17b will be described later.

In general, in a high-output laser, coating of a dielectric film is made so that the reflectance (Rf) of the front end face is as low as 10% or less and the reflectance (Rr) of the rear end face is as high as 75% or more. The reasons for this are to improve the light extraction efficiency from the front end face and also reduce the light density at the front end face to improve the light output level at which the laser end face is melted down (causes COD). In this relation, the light density of the waveguide in the cavity direction is higher on the front end face side than on the rear end face side, and thus a larger number of carriers are necessary in the active layer to be consumed for laser oscillation on the front end face side. For this reason, a larger amount of current should be injected on the front end face side where the light density inside the cavity is relatively high, to improve the slope efficiency in the current-light output characteristic and thus attain an element excellent in temperature characteristic. In other words, in a laser having a reflectance lower on the front end face side than on the rear end face side, the stripe width should be made larger on the front end face side than on the rear end face side, so that the injected current can contribute to stimulated emission efficiently, to enhance the slope efficiency.

Figure 3:
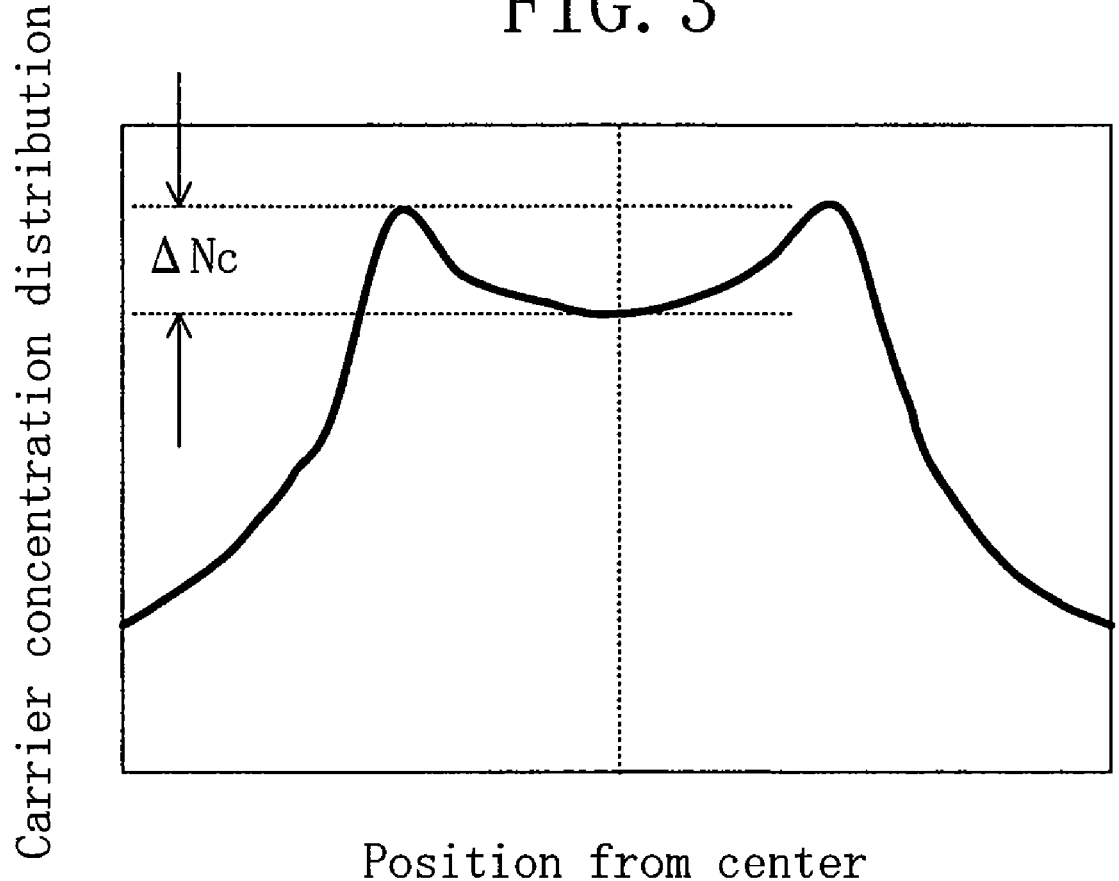
FIG. 3 is a graph showing an example of horizontal distribution of the operating carrier density in an active layer of a general semiconductor laser device.

The stripe width will then be described. As shown in FIG. 3, the horizontal distribution of the operating carrier density in the active layer is relatively depressed in the ridge center. This is a phenomenon called spatial hole burning of carriers, caused by occurrence of intense stimulated emission in the center of the stripe portion. As the size of this depression ($\Delta Nc$) of the carrier density is greater, the gain distribution in the active layer is lower in the center of the stripe portion high in light density and the gain on both sides thereof is greater. Accordingly, only with minimal horizontal asymmetry of the stripe, the light distribution will move horizontally causing a kink. To suppress such a phenomenon, $\Delta Nc$ must be reduced. To reduce $\Delta Nc$, it is effective to reduce the stripe width W as much as possible to allow the current flow to be concentrated in a narrow region of the active layer. In this way, carriers consumed under stimulated emission in the portion of the active layer right under the center of the stripe portion high in light distribution intensity can be compensated for with high current injection density. In reverse, if the stripe width is increased, the light distribution is confined inside the stripe portion, increasing $\Delta Nc$. Thus, the kink level will decrease as the stripe width is increased.

The stripe width affects the series resistance of the element: an element having a wider stripe portion is smaller in series resistance permitting reduction in operating voltage. Reduction in operating voltage leads to reduction in power consumption. Since the calorific power also decreases, the temperature characteristic improves. Moreover, the drive voltage of the laser device can be reduced, and this is advantageous in circuit design. Thus, the stripe width is desirably as large as possible as long as the kink level does not decrease.

To summarize the above, (1) in consideration of the current-light output characteristic, the stripe width should be tapered from the front end face side toward the rear end face side for improving the external differential quantum efficiency, (2) the stripe width should be large for reducing the operating voltage, and (3) the stripe width should be small for suppressing occurrence of a kink. In other words, to reduce the operating current value and the operating voltage and enhance the kink level, the stripe portion should preferably be widened on the front end face side, narrowed on the rear end face side and tapered in the region therebetween.

Figure 4:
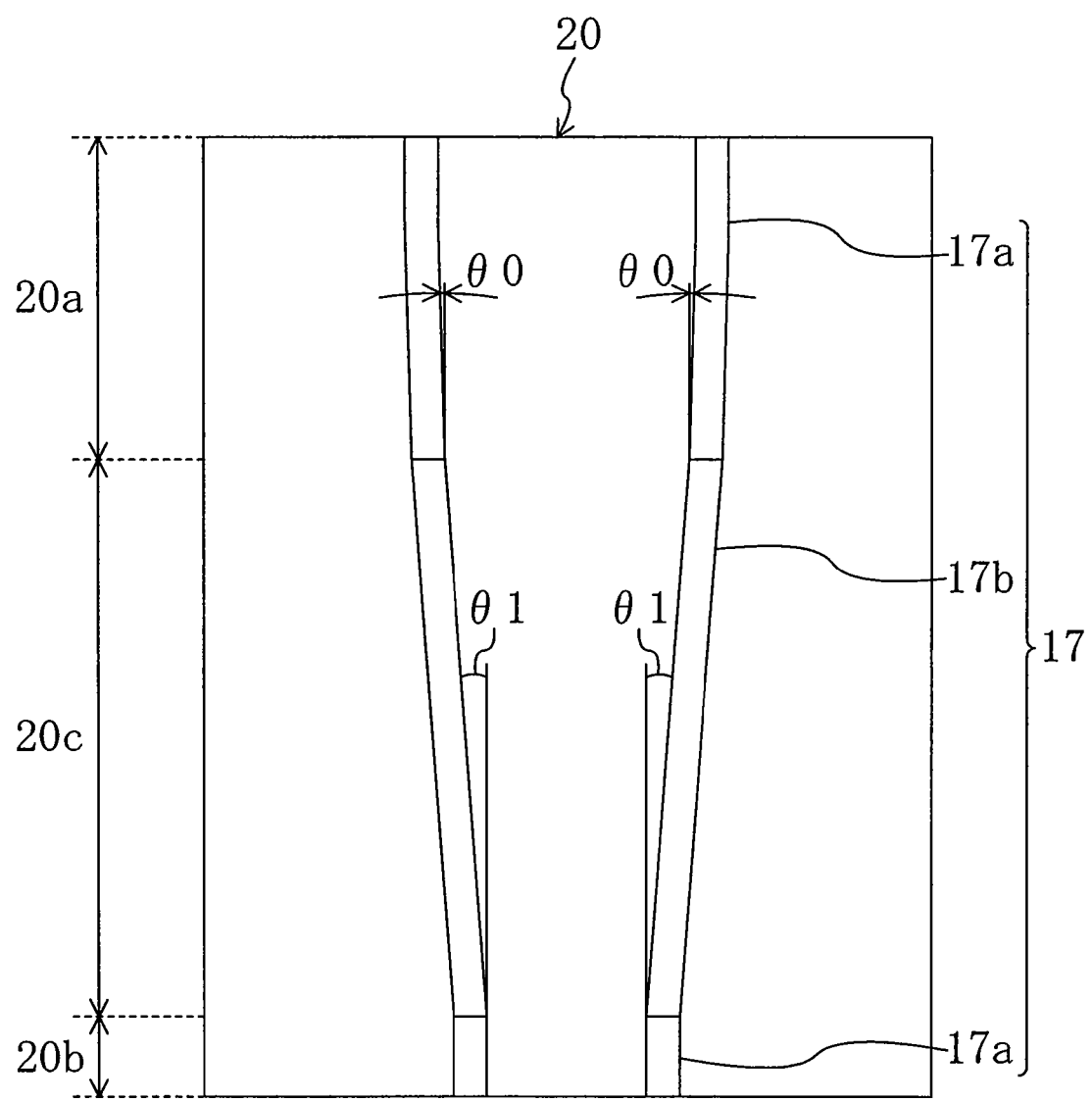
FIG. 4 is a plan view of a first alteration to the semiconductor laser device of the embodiment of the present invention.

The stripe width may otherwise be changed continuously from the front end face side toward the rear end face side. However, a change in stripe width will increase the scattering loss of guided light at the ridge sidewalls causing efficiency degradation. Accordingly, to reduce the increase amount of the waveguide loss occurring with a change in stripe width, a smaller change in stripe width is better at the front end face high in light density. In view of this, as shown in FIG. 2, the stripe width is preferably fixed in the first region 20a on the front end face side. If it is still desired to change the stripe width in the first region 20a, the change amount is preferably smaller than that in the change region 20c as shown in FIG. 4.

In other words, the taper angle $\theta 0$ in the first region 20a should be smaller than the taper angle $\theta 1$ in the change region 20c.

In summary, the relationships $Wf \geq Wm1$, $Wm1 > Wm2$ and $(Wf-Wm1)/L1 > (Wm1-Wm2)/L2$ are preferably satisfied where Wf is the stripe width of the front end face, Wm1 is the stripe width of the change region at the end closer to the front end face, Wm2 is the stripe width of the change region at the end closer to the rear end face, L1 is the length of the first region 20a, and L2 is the length of the change region 20c.

To state differently, when the stripe is formed so that the stripe width changes in the cavity direction and there exist a plurality of regions different in the change rate of the stripe width in the cavity direction, the change rate may be set to be smaller in a region higher in average light density.

In the vicinity of a laser end face, to suppress variations in stripe width due to cleaving displacement that may occur in separation of elements by cleaving, the stripe width is preferably fixed over a region having a length of about 10 μm or more from the end face. This is because if the stripe width varies, the width of the distribution of light propagating in the waveguide changes causing a change in a far-field pattern (FFP) radiated from the cavity end face. In FIG. 2, the stripe width is fixed over 200 μm from the front end face and 50 μm from the rear end face. In FIG. 4, also, the stripe width is fixed over 10 μm from the front end face.

On the rear end face side, variations in stripe width due to variations in cleaving position will hardly affect the pattern of FFP radiated from the front end face. Also, since the light density is small on the rear end face side, the scattering loss occurring at the ridge sidewalls is small even though $\Delta n$ is small. Accordingly, the stripe width of the second region is not necessarily fixed.

When the change region changing in stripe width is provided, propagating light scatters from the ridge sidewalls, resulting in increase in waveguide loss. In view of this, if such occurrence of waveguide loss due to scattering of light from the ridge sidewalls can be suppressed, the external differential quantum efficiency can further be increased permitting attainment of a semiconductor laser that emits light with high efficiency. To achieve high-temperature, high-output operation of a semiconductor laser, it is necessary to increase the cavity length, to enhance heat radiation and reduce the operating carrier density, to thereby suppress an overflow of thermally excited carriers from the active layer during high-temperature operation.

For a red laser for a recording 16x high-speed writable optical disk system, it is necessary to achieve high-output operation of 300 mW or more at a high temperature of 80° C. or more. The red laser is therefore required to have a long cavity length of 1500 μm or more. In this relation, the external differential quantum efficiency in the light output-current characteristic is proportional to mirror loss $(\alpha_m)$/(mirror loss $(\alpha_m)$+waveguide loss $(\alpha_w)$). The external differential quantum efficiency is expressed by $$\eta_d = \eta_i \eta_e \frac{\alpha_m}{\alpha_m + \alpha_w} \quad (1)$$

where $\eta_i$ is the internal quantum efficiency indicating the rate at which injected carriers are radiatively recombined and $\eta_e$ is the efficiency of extraction of laser oscillated light from the front end face. In this relation, the mirror loss is expressed by $$\alpha_m = \frac{1}{2L} \text{Log}_e \left( \frac{1}{R_f R_r} \right) \quad (2)$$

where L is the cavity length.

As is found from the equation (2), the mirror loss is smaller as the cavity length is larger. It is therefore found that the influence of the waveguide loss on the external differential quantum efficiency is greater as the cavity length is larger.

Figure 5:
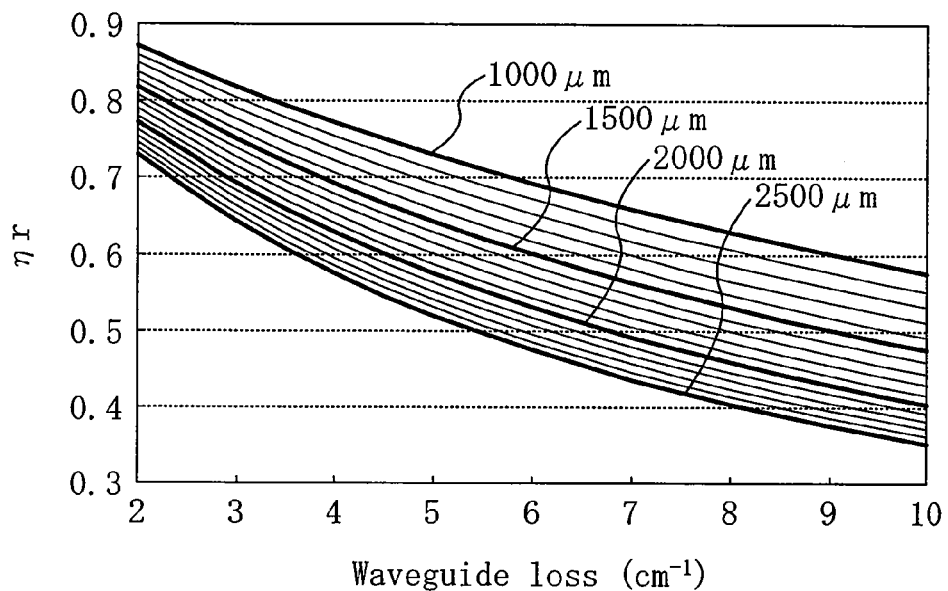
FIG. 5 is a graph showing the influence of the cavity length on the relationship between mirror loss ($\alpha_m$)/(mirror loss ($\alpha_m$)+waveguide loss ($\alpha_w$)) and the waveguide loss.

FIG. 5 shows the results of examination of the cavity length dependency of the relationship between $\eta_r$ and the waveguide loss, where $\eta_r$ is mirror loss $(\alpha_m)$/(mirror loss $(\alpha_m)$+ waveguide loss $(\alpha_w)$). In this embodiment, to reduce the waveguide loss to thereby enhance the external differential quantum efficiency, an actual refractive index waveguide structure is adopted in which the current block layer is made of a dielectric material roughly transparent to laser light and lower in refractive index than the clad layers. The waveguide loss in this case is normally 10 cm$^{-1}$ or less. FIG. 5 therefore shows the results within the range of the waveguide loss of 10 cm$^{-1}$ or less.

As shown in FIG. 5, as the cavity length is larger, the external differential quantum efficiency is lower and the increase in waveguide loss is more influential on $\eta_r$. When the cavity length is 1500 μm, $\eta_r$ decreases by about 10% as the waveguide loss increases by 1 cm$^{-1}$ to 2 cm$^{-1}$. This means that the external differential quantum efficiency decreases by about 10%, which causes serious obstruction in high-temperature, high-output operation.

From the above, it is found that even though a cavity length of 1500 μm or more is secured to enhance the heat radiation, the external differential quantum efficiency decreases because $\eta_r$ decreases, and yet the influence of the waveguide loss on the decrease of the external differential quantum efficiency increases.

Therefore, in a laser having a cavity length as large as 1500 μm or more, high-output operation low in operating current won't be attained unless the waveguide loss is reduced to a minimum. The operating current value should be as small as possible from the standpoints of limitation of the drive current capacity of a laser drive circuit and increase of the calorific amount due to increase in power consumption.

To attain a high-output laser low in operating current, increase in waveguide loss must be suppressed. However, in the semiconductor laser device of this embodiment having the change region whose stripe width narrows from the front face toward the rear face along the cavity length, the waveguide loss may possibly be great due to the scattering loss from the ridge sidewalls.

Figure 6:
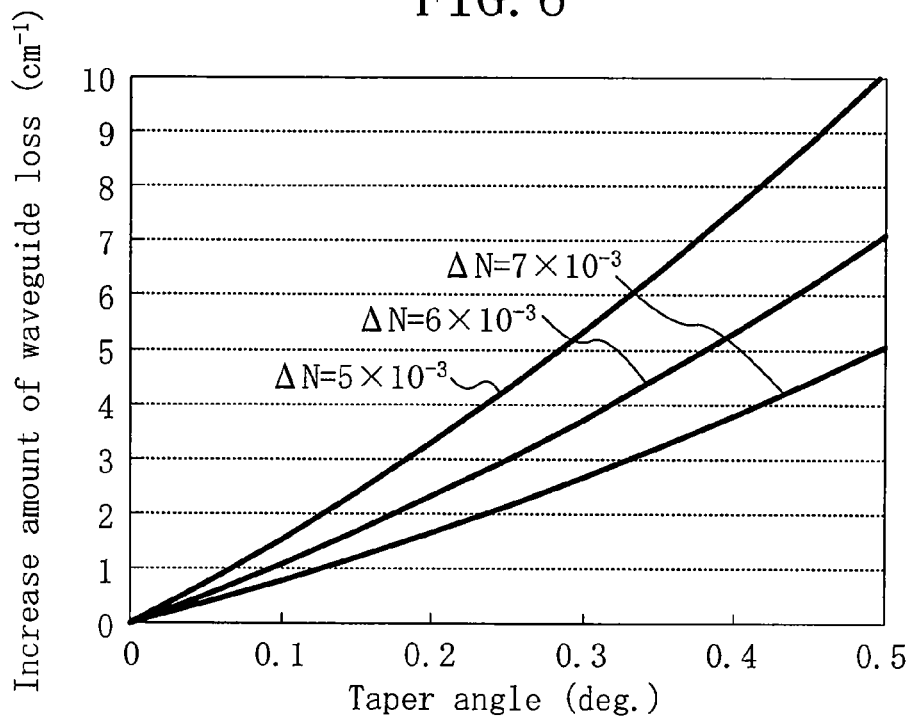
FIG. 6 is a graph showing the influence of the effective refractive index difference (Δn) between the inside and outside of the stripe portion on the relationship between the taper angle and the increase amount in waveguide loss.

FIG. 6 shows the influence of the effective refractive index difference (Δn) between the inside and outside of the stripe portion on the relationship between the taper angle and the increase amount of waveguide loss. The taper angle as used herein refers to the angle θ1 of the change of the stripe width shown in FIG. 2.

As shown in FIG. 6, the waveguide loss increases as the taper angle is larger. Also, the increase amount of the waveguide loss decreases as Δn is larger. If Δn is small, laser light propagating in the waveguide expands outside the stripe portion. Therefore, there arises the necessity of injecting a current required for laser oscillation even in the portion of the active layer outside the stripe portion, resulting in increase in oscillation threshold current value and operating current value. In reverse, if Δn is large, the light distribution is intensely confined inside the stripe portion, increasing the light density inside the stripe portion. The magnitude of spatial hole burning of carriers therefore increases, and thus a kink is more likely to occur. Also, with increase in light density, COD in which the end face is melted down with laser light is likely to occur. Hence, in a high-output laser, Δn is generally set at about 5×10$^{-3}$ to 7×10$^{-3}$ to stabilize the transverse mode of the light distribution. Within this range of Δn, to suppress the increase in waveguide loss to 2 cm$^{-1}$ or less to thereby prevent the external differential quantum efficiency from decreasing by 10% or more, the taper angle must be 0.23° or less when Δn is 7×10$^{-3}$. When Δn is 5×10$^{-3}$, the taper angle must be 0.12° or less. Accordingly, by setting the taper angle at 0.12° or less, the occurrence of waveguide loss can be 2 cm$^{-1}$ or less for a waveguide having Δn of 5×10$^{-3}$ or more. Furthermore, by setting the taper angle at 0.05° or less, the occurrence of waveguide loss can be 1 cm$^{-1}$ or less for a waveguide having Δn of 5×10$^{-3}$ or more.

In other words, Δn may be set at a comparatively small value in the vicinity of the front end face of the cavity from which light is extracted, to obtain a desired light distribution, and at a high value in the region in which the stripe width changes. With this setting, the increase in the increase amount of the waveguide loss with the change in stripe width can be suppressed.

In the semiconductor laser device of this embodiment, as the current block layer 17, the first current block layer 17a made of SiN is provided for the first and second regions 20a and 20b, and the second current block layer 17b made of SiO$_2$ is provided for the change region 20c. The refractive index of the second current block layer 17b is therefore smaller than that of the first current block layer 17a. With the second current block layer 17b small in refractive index provided in the change region 20c, Δn can be changed while dp is the same. Specifically, the value of Δn in the change region 20c is 7×10$^{-3}$, and the value of Δn in the first and second regions 20a and 20b is 5×10$^{-3}$.

In the example shown in FIG. 2, the stripe width at the front end face is 3.5 μm, the stripe width at the rear end face is 2.1 μm, and the cavity length is 1750 μm. The stripe width is fixed in the first region 20a over 200 μm from the front end face and in the second region 20b over 50 μm from the rear end face. The taper angle θ1 is therefore 0.03°. Accordingly, the increase in waveguide loss due to the change in stripe width can be a very small value of about 0.3 cm$^{-1}$. As a result, as shown in FIG. 5, the influence of the scattering loss occurring due to the change in stripe width on the decrease in $\eta_r$ can be suppressed to a very small level of not more than several percent.

Figure 7:
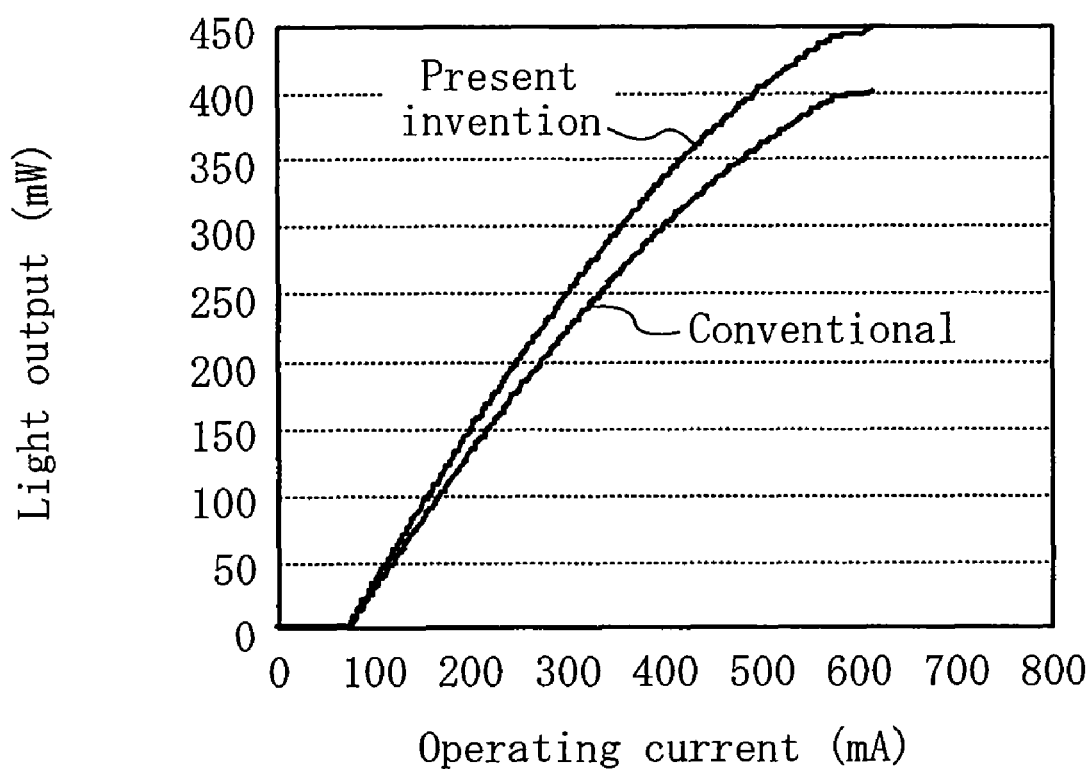
FIG. 7 is a graph of the current-light output characteristic of the semiconductor laser device of the embodiment of the present invention, shown in comparison with a conventional semiconductor laser device.

FIG. 7 shows the current-light output characteristic of the semiconductor laser device of this embodiment. The operation conditions are 80° C., 50 ns and a pulse duty ratio of 40%. In the semiconductor laser device of this embodiment, the value of Δn was set at 5.5×10$^{-3}$ in the first and second regions and 7×10$^{-3}$ in the change region. In the conventional semiconductor laser device, Δn was fixed at 5.5×10$^{-3}$. As is found from FIG. 7, the operating current is lower by about 10% in the semiconductor laser device of this embodiment than in the conventional semiconductor laser, exhibiting the effect of reducing the waveguide loss.

Figure 8:
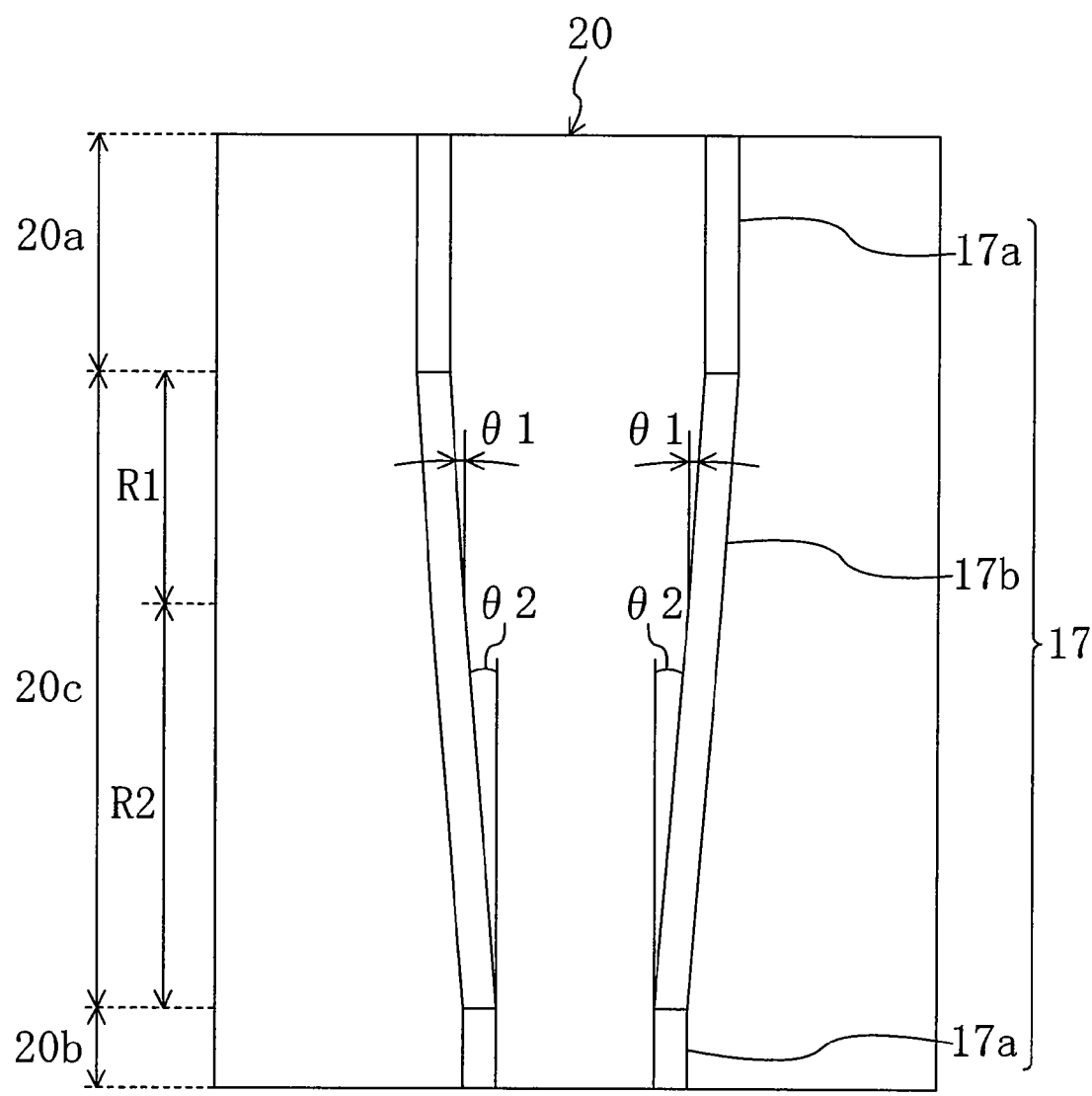
FIG. 8 is a plan view of a second alteration to the semiconductor laser device of the embodiment of the present invention.

In the example shown in FIG. 2, the change rate of the stripe width in the change region was fixed. The stripe width is only necessary to be larger on the front end face side low in end face reflectance than on the rear end face side relatively high in end face reflectance. Hence, as shown in FIG. 8, the change rate of the stripe width may change in two stages in the change region 20c. In this case, also, the value of Δn is made larger in the change region 20c than in the first and second regions 20a and 20b.

Figure 9:
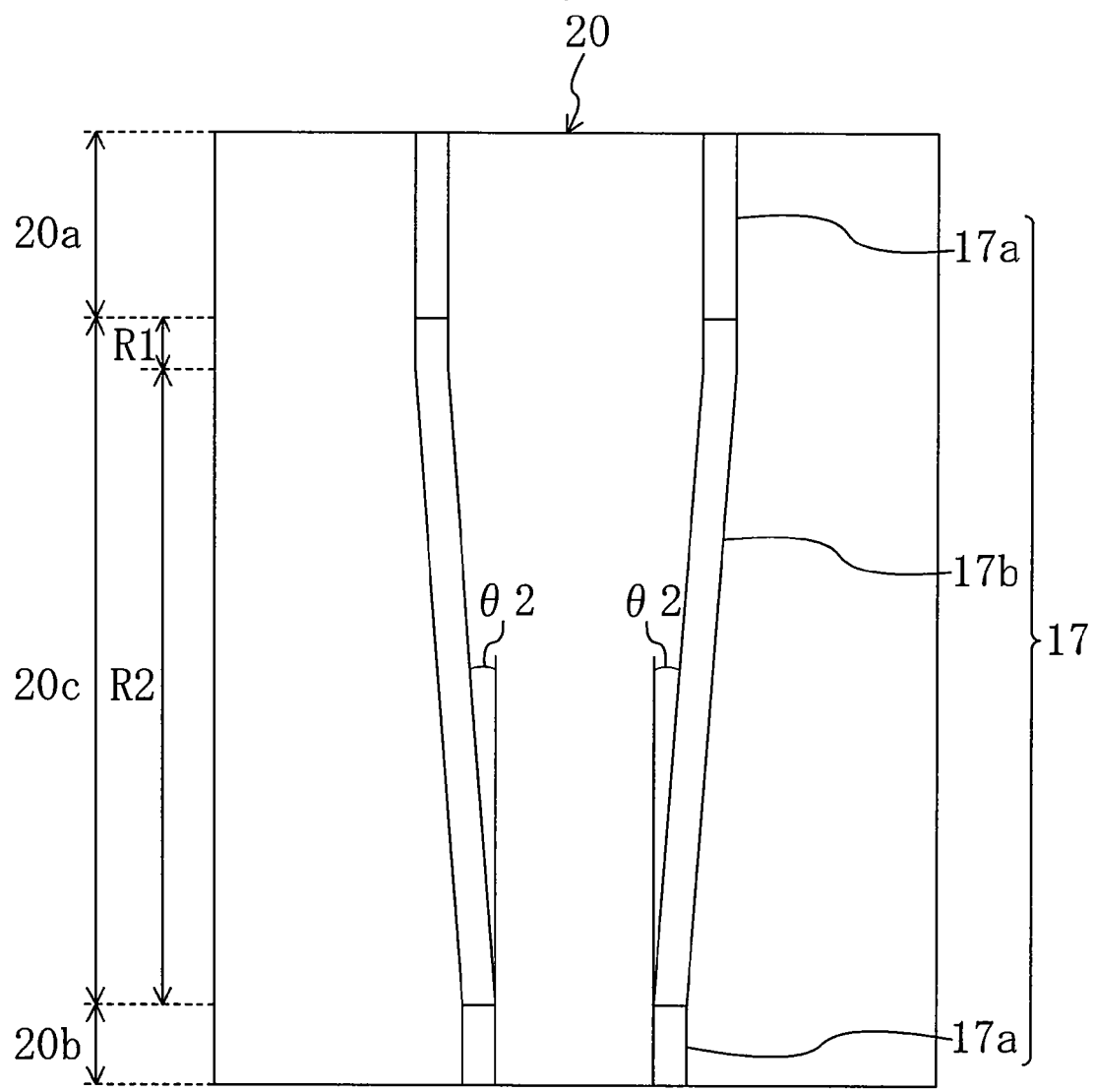
FIG. 9 is a plan view of a third alteration to the semiconductor laser device of the embodiment of the present invention.

In the 2-stage change, the change amount of the stripe width is preferably smaller in a region R1 on the front end face side than in a region R2 on the rear end face side. That is, the taper angle θ1 in the region R1 is preferably smaller than the taper angle θ2 in the region R2. Hence, since the taper angle is small in the portion closer to the front end face high in light density, occurrence of scattering loss at the ridge sidewalls can further be suppressed. In this case, also, θ1 is set at 0.23° or less, preferably 0.12° or less, more preferably 0.05° or less. The taper angle θ1 is only necessary to be smaller than θ2. It may even be 0° as shown in FIG. 9 so that the region R1 on the front end face side is a fixed-width region.

Figure 10:
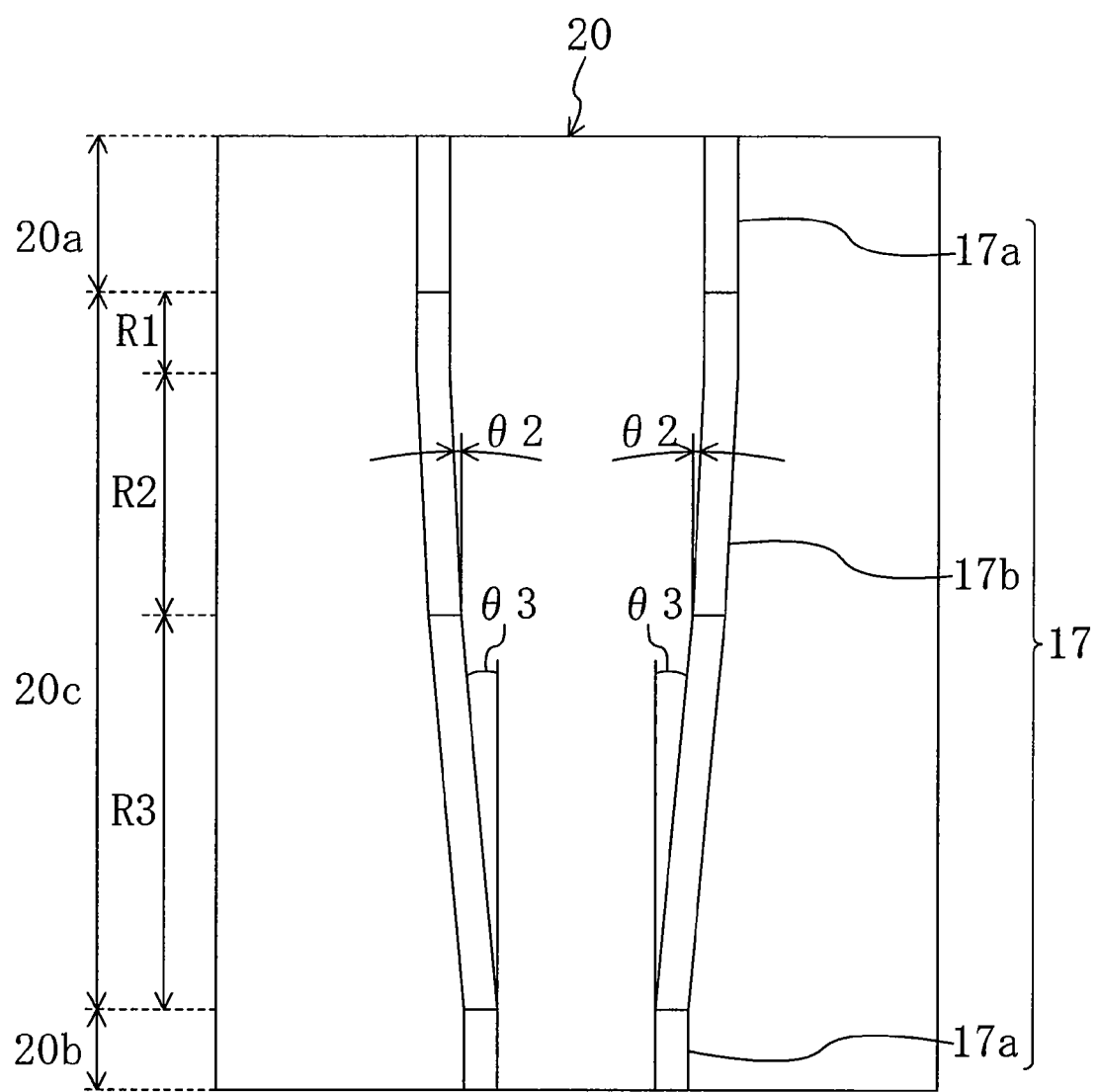
FIG. 10 is a plan view of a fourth alteration to the semiconductor laser device of the embodiment of the present invention.

The change rate of the stripe width may be in two or more stages. In this case, the change rate may be made to increase gradually from the region on the front end face side toward the region on the rear end face side. Also, as shown in FIG. 10, θ1 may be 0° so that the region R1 closest to the front end face is a fixed-width region.

Although the change in stripe width was linear in the above examples, it may not necessarily be linear. The stripe portion can be of any shape as long as the stripe width at the front end face low in end face reflectance is larger than the stripe width at the rear end face relatively high in end face reflectance and the absolute value of the change rate of the stripe width with respect to the cavity length in the change region is 0.23° or less in terms of the angle. In this case, to further suppress the occurrence of waveguide loss caused by the taper shape, the absolute value of the change rate of the stripe width in the change region may preferably be 0.12° or less in terms of the angle, more preferably 0.05° or less.

A large stripe width at the front end face will increase the current injection area, permitting decrease in the differential resistance of the element and increase in the light output level at which heat saturation occurs during high-temperature operation, on one hand. On the other hand, a large stripe width will cause failure in cutoff of a high-order transverse mode, and thus a kink is likely to occur in the current-light output characteristic. Hence, the stripe width at the front end face may be a value in the range between 2.5 μm and 5 μm inclusive, preferably between 3 μm and 4 μm inclusive, more preferably between 3.2 μm and 3.7 μm inclusive. Likewise, a large stripe width at the rear end face will increase the current injection area permitting decrease in the differential resistance of the element on one hand. On the other hand, a large stripe width will cause failure in cutoff of a high-order transverse mode, and thus a kink is likely to occur in the current-light output characteristic. Moreover, a tapered current injection region will decrease the current use efficiency. Hence, the stripe width at the rear end face may be a value in the range between 1 μm and 3 μm inclusive, preferably between 1.5 μm and 2.5 μm inclusive, more preferably between 1.7 μm and 2.3 μm inclusive.

Hereinafter, a fabrication method for a semiconductor laser of an embodiment of the present invention will be described with reference to the relevant drawings. FIGS. 11A to 11D show the fabrication method for a semiconductor laser step by step.

First, as shown in FIG. 1A, on a substrate 10 made of n-type GaAs having a plane tilted from (100) plane by 10° in [011] direction as the principal plane, sequentially formed by metal-organic chemical vapor deposition (MOCVD) are a buffer layer 11 made of n-type GaAs having a thickness of 0.5 μm, a first clad layer 12 made of n-type $(Al_{0.7}Ga_{0.3})_{0.51}In_{0.49}P$ having a thickness of 1.2 μm, an active layer 13, a second clad layer 14 made of p-type $(Al_{0.7}Ga_{0.3})_{0.51}In_{0.49}P$, a protection layer 15 made of p-type $Ga_{0.51}In_{0.49}P$ having a thickness of 50 nm and a contact layer 16 made of p-type GaAs having a thickness of 0.3 μm. Molecular beam epitaxy (MBE) may otherwise be adopted in place of the MOCVD method.

In this embodiment, the active layer 13 is a distorted quantum well active layer, having a first guide layer made of $(Al_{0.5}Ga_{0.5})_{0.51}In_{0.49}P$, three well layers made of GaInP, two barrier layers made of AlGaInP and a second guide layer made of AlGaInP. In place of the distorted quantum well active layer, non-distorted quantum well or bulk may be adopted. The active layer may be of p-type or n-type or otherwise undoped.

Figure 11A:
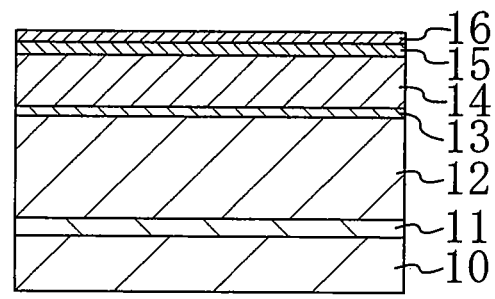
FIGS. 11A to 11D are cross-sectional views showing step by step a fabrication method for a semiconductor laser device of an embodiment of the present invention.
Figure 11B:
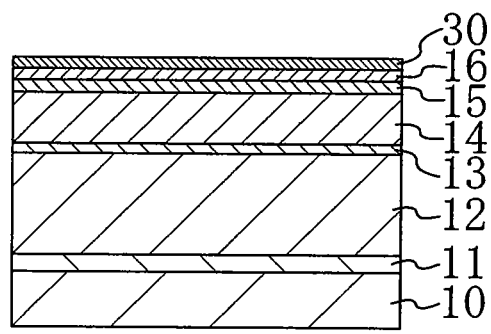

As shown in FIG. 11B, after retrieval of the substrate from a MOCVD reactor, a silicon oxide film 30 having a thickness of 0.3 μm is deposited on the contact layer 16 by thermal CVD (370° C.).

Figure 11C:
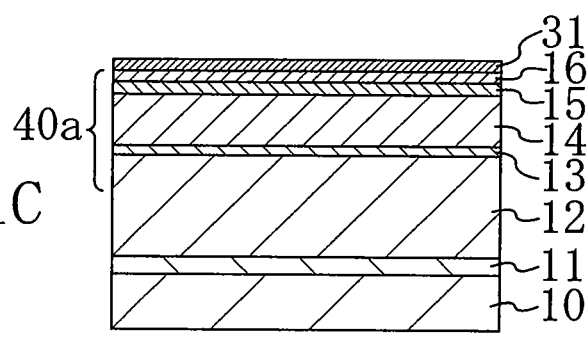

The silicon oxide film 30 is then patterned by photolithography and dry etching to expose the contact layer 16 in a region over about 30 μm from an end face. Subsequently, as shown in FIG. 11C, Zn is thermally diffused in the exposed portion of the contact layer 16 using a diffusion source 31 made of Zn, to form an end face window 40a in the vicinity of the end face.

End face destruction may occur at about 100 mW unless an impurity is diffused in the vicinity of the end face to disorganize the quantum well active layer. To attain high-output operation of 100 mW or more, therefore, it is preferred to form the end face window 40a transparent to laser light by disorganizing the portion of the quantum well active layer at the cavity end face.

Figure 11D:
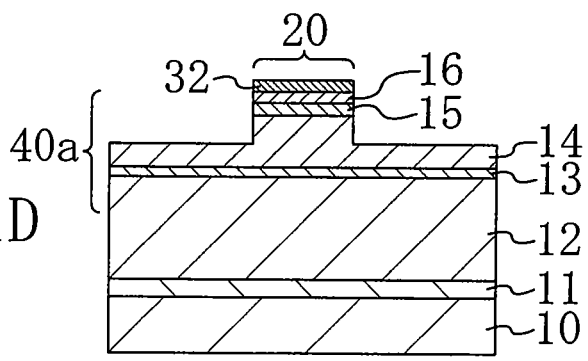

Thereafter, a silicon oxide film 32 having a thickness of 0.3 μm is formed on the contact layer 16 by atmospheric pressure thermal CVD (370° C.), and then patterned by photolithography and dry etching. The patterning is made to form a stripe having a width of 3.5 μm in a first region closer to the front end face from which laser light is extracted, a stripe having a width of 2.1 μm in a second region closer to the rear end face and a tapered stripe narrowed gradually from the width of 3.5 μm to the width of 2.1 μm in a change region between the first and second regions. Using the patterned silicon oxide film 32 as a mask, the contact layer 16, the protection layer 15 and the second clad layer 14 are sequentially etched selectively using a sulfuric acid- or hydrochloric acid-based etchant, to form a mesa-shaped stripe portion 20 as shown in FIG. 11D. After the formation of the mesa-shaped stripe portion 20, the silicon oxide film used as the mask is removed with a hydrofluoric acid-based solution.

Figure 12A:
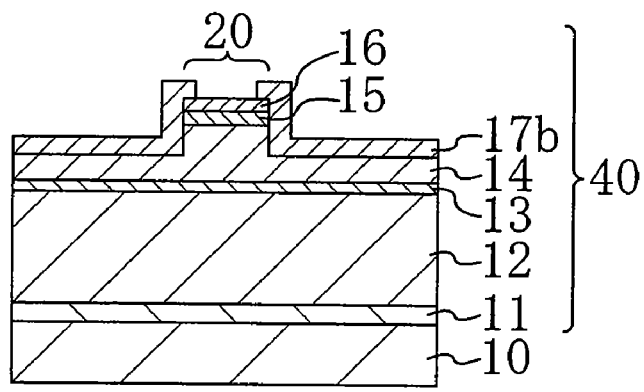
FIGS. 12A to 12C are cross-sectional views showing step by step the fabrication method for the semiconductor laser device of the embodiment of the present invention.

A silicon oxide film that is to be the second current block layer 17b is then formed over the entire surface of the resultant substrate. Thereafter, a resist film is patterned by photolithography so that the top surface of the contact layer 16 and the regions on both sides of the stripe portion 20 including the sidewalls of the stripe portion 20 in the first and second regions are open. Using the patterned resist film as a mask, the silicon oxide film is selectively removed. In this way, as shown in FIG. 12A, the second current block layer 17b is formed in the change region. Note that FIG. 12A shows the cross section in the change region.

Figure 12B:
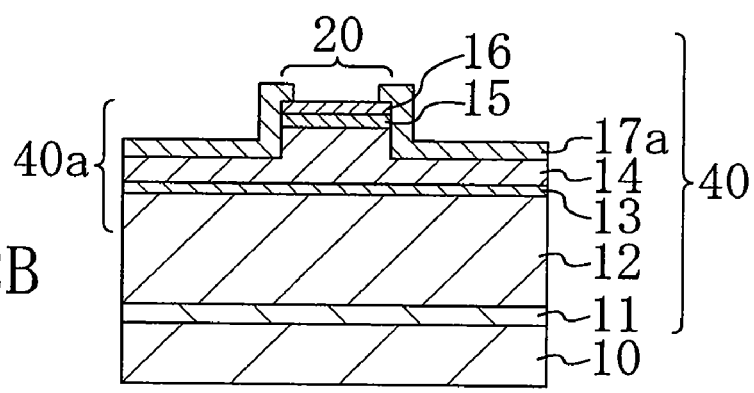

A resist film is then patterned by photolithography so that only the regions on both sides of the stripe portion 20 including the sidewalls of the stripe portion 20 in the first and second regions are open. Thereafter, a SiN film that is to be the first current block layer 17a is formed, and then any portion of the SiN film formed on the resist film is lifted off. In this way, as shown in FIG. 12B, the first current block layer 17a is formed in the first and second regions.

Figure 12C:
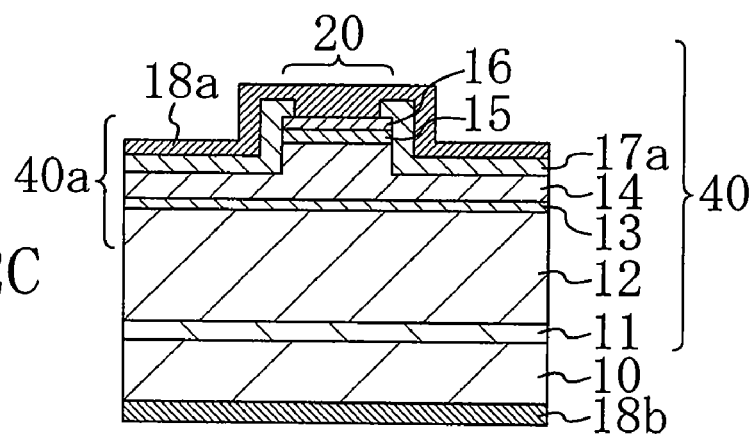
Figure 13:
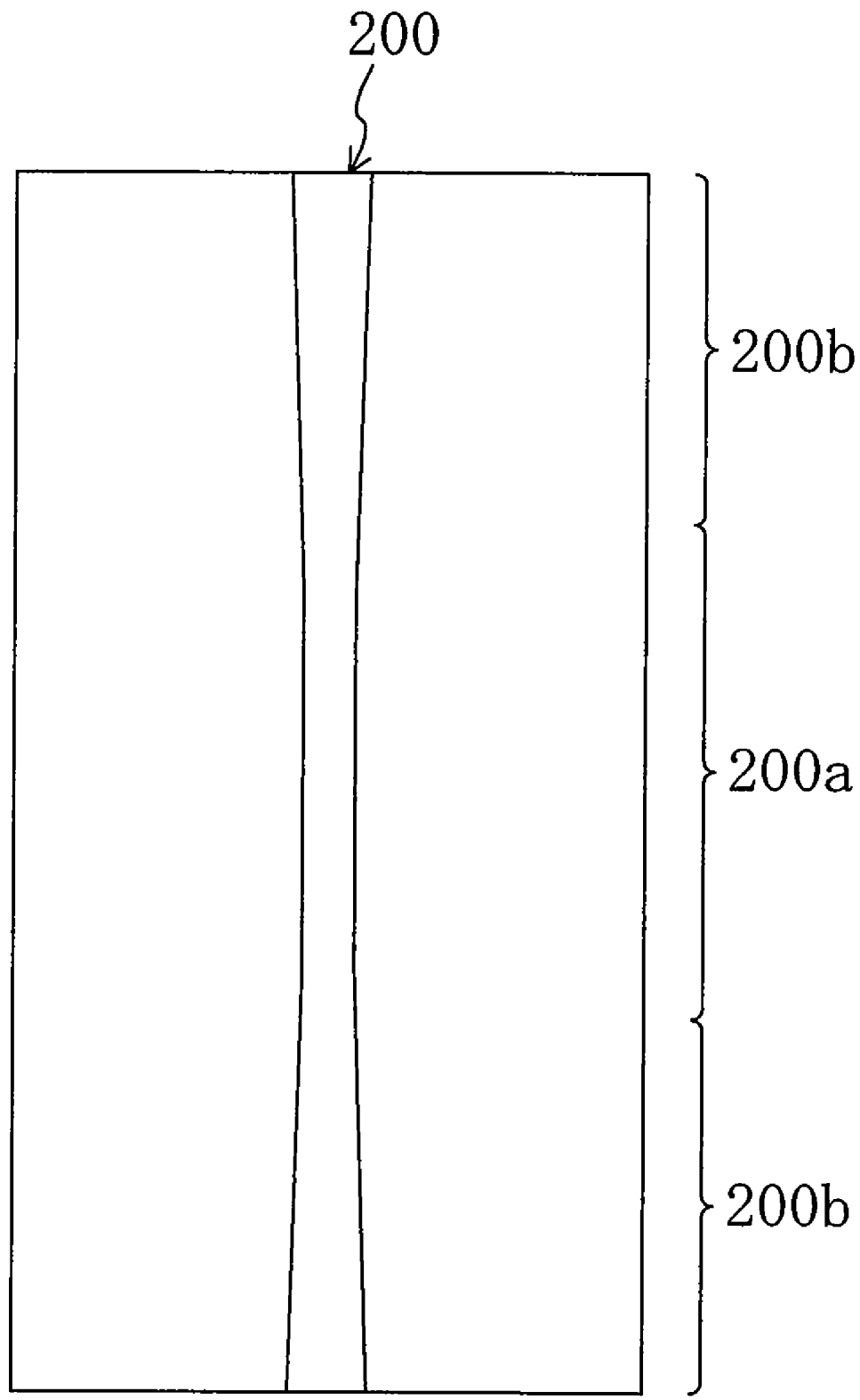
FIG. 13 is a plan view of a conventional semiconductor laser device.

Thereafter, as shown in FIG. 12C, a P electrode 18a is formed on the contact layer 16, and an N electrode 18b is formed on the back surface of the substrate.

In the illustrated example, SiN was used for the first current block layer and SiO$_2$ was used for the second current block layer. Alternatively, any other material may be used if, using such a material, Δn in the first and second regions falls within a range in which a desired light distribution is obtained and Δn can be greater in the change region than in the first and second regions. Specifically, any of silicon oxide (SiO$_2$), silicon nitride (SiN), titanium oxide (TiO$_2$), aluminum oxide (Al$_2$O$_3$), zirconium oxide (ZrO$_2$), tantalum oxide (Ta$_2$O$_5$), cesium oxide (CeO$_2$), niobium oxide (Nb$_2$O$_5$), amorphous silicon hydroxide and the like may be appropriately selected in combination. Otherwise, a mixture of any of these materials or a multilayer film made of any of these materials may be used.

In this embodiment, a red semiconductor laser device having an active layer made of a material represented by a general formula (Al$_a$Ga$_b$)$_c$In$_{1-c}$P ($0 \leq a<1$, $0<b \leq 1$, $a+b=1$, $0<c<1$) was described. Substantially the same effects will also be obtainable in an infrared semiconductor laser device having an active layer made of a material represented by a general formula (Al$_a$Ga$_b$)$_c$In$_{1-c}$P ($0 \leq a<1$, $0<b \leq 1$, $a+b=1$, $0<c<1$).

In this embodiment, the ridge stripe portion was given as the structure for current injection. Any other stripe structure may also be provided to obtain substantially the same effects.

As described above, according to the present invention, it is possible to implement a semiconductor laser device that is small in decrease of the external differential quantum efficiency, is less likely to cause saturation of the luminous efficiency in the high-output operation state and permits stable fundamental transverse mode oscillation. The present invention is therefore useful in particular as red and infrared semiconductor laser devices and fabrication methods for the same.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor laser device comprising:
a cavity structure including a first clad layer, an active layer and a second clad layer sequentially formed on a substrate,
wherein the second clad layer has a stripe portion extending between a front end face from which laser light is extracted and a rear end face opposite to the front end face,
the stripe portion has a first region located closer to the front end face, a second region located closer to the rear end face and a change region whose stripe width changes located between the first region and the second region,
the effective refractive index difference between the inside and outside of the stripe portion in the change region is greater than the effective refractive index difference between the inside and outside of the stripe portion in the first region,
the active layer is made of a material represented by a general formula (Al$_a$Ga$_b$)$_c$In$_{1-c}$P ($0 \leq a<1$, $0<b \leq 1$, $a+b=1$, $0<c<1$),
the first and second clad layers are made of a material represented by a general formula (Al$_d$Ga$_e$)$_f$In$_{1-f}$P ($0<d<1$, $0<e<1$, $d+e=1$, $0<f<1$), and
the stripe portion is a ridge stripe portion, and
wherein the device further comprises a first current block layer covering sidewalls of the ridge stripe portion in the first region and a second current block layer covering sidewalls of the ridge stripe portion in the change region, and
the refractive index of the first current block layer is greater than the refractive index of the second current block layer.

2. The semiconductor laser device of claim 1, wherein the first region includes a fixed-width portion whose width is fixed, and
the fixed-width portion has a length of 10 μm or more.

3. The semiconductor laser device of claim 1, wherein the reflectance of the front end face is equal to or smaller than the reflectance of the rear end face, and
the stripe width is larger at the front end face than at the rear end face.

4. The semiconductor laser device of claim 1, wherein the active layer is a quantum well active layer.

5. The semiconductor laser device of claim 4, wherein at least one of a region near the front end face and a region near the rear end face is disorganized by impurity diffusion.

6. The semiconductor laser device of claim 1, wherein the first current block layer and the second current block layer are made of dielectric materials different from each other.

7. The semiconductor laser device of claim 1, wherein the first current block layer and the second current block layer are made of the same dielectric material.

8. The semiconductor laser device of claim 1, wherein the first current block layer and the second current block layer are respectively made of any one of, or a compound containing at least two of, SiO$_2$, SiN$_x$, Al$_2$O$_3$, TiO$_2$, ZrO$_2$, Ta$_2$O$_5$, CeO$_2$ and Nb$_2$O$_5$.

9. A fabrication method for a semiconductor laser device, comprising the steps of:
(a) sequentially forming a first clad layer, an active layer and a second clad layer on a substrate;
(b) forming a stripe portion having a change region whose stripe width changes by etching the second clad layer; and
(c) forming a first current block layer so as to cover a region other than the change region and a second current block layer so as to cover the change region,
wherein in the step (c), the first current block layer and the second current block layer are formed so that the effective refractive index difference between the inside and outside of the stripe portion in the change region is greater than the effective refractive index difference between the inside and outside of the stripe portion in the region other than the change region,
the active layer is made of a material represented by a general formula (Al$_a$Ga$_b$)$_c$In$_{1-c}$P ($0 \leq a<1$, $0<b \leq 1$, $a+b=1$, $0<c<1$),
the first and second clad layers are made of a material represented by a general formula (Al$_d$Ga$_e$)$_f$In$_{1-f}$P ($0<d<1$, $0<e<1$, $d+e=1$, $0<f<1$),
the stripe portion is a ridge stripe portion,
said first current block layer covering sidewalls of the ridge stripe portion in the first region and said second current block layer covering sidewalls of the ridge stripe portion in the change region, and the refractive index of the first current block layer is greater than the refractive index of the second current block layer.

10. A semiconductor laser device comprising:

a cavity structure including a first clad layer, an active layer and a second clad layer sequentially formed on a substrate, wherein the second clad layer has a stripe portion extending between a front end face from which laser light is extracted and a rear end face opposite to the front end face, the stripe portion has a first region located closer to the front end face, a second region located closer to the rear end face and a change region whose stripe width changes located between the first region and the second region, the effective refractive index difference between the inside and outside of the stripe portion in the change region is greater than the effective refractive index difference between the inside and outside of the stripe portion in the first region, wherein the active layer is made of a material represented by a general formula $Al_aGa_{1-a}As$ ($0 \leq a<1$), and the first and second clad layers are made of a material represented by a general formula $(Al_dGa_e)_fIn_{1-f}P$ ($0<d<1$, $0<e<1$, $d+e=1$, $0<f<1$), and the stripe portion is a ridge stripe portion, and wherein the device further comprises a first current block layer covering sidewalls of the ridge stripe portion in the first region and a second current block layer covering sidewalls of the ridge stripe portion in the change region, and the refractive index of the first current block layer is greater than the refractive index of the second current block layer.

11. A fabrication method for a semiconductor laser device, comprising the steps of:

(a) sequentially forming a first clad layer, an active layer and a second clad layer on a substrate;

(b) forming a stripe portion having a change region whose stripe width changes by etching the second clad layer; and (c) forming a first current block layer so as to cover a region other than the change region and a second current block layer so as to cover the change region, wherein in the step (c), the first current block layer and the second current block layer are formed so that the effective refractive index difference between the inside and outside of the stripe portion in the change region is greater than the effective refractive index difference between the inside and outside of the stripe portion in the region other than the change region, wherein the active layer is made of a material represented by a general formula $Al_aGa_{1-a}As$ ($0 \leq a<1$), and the first and second clad layers are made of a material represented by a general formula $(Al_dGa_e)_fIn_{1-f}P$ ($0<d<1$, $0<e<1$, $d+e=1$, $0<f<1$), the stripe portion is a ridge stripe portion, said first current block layer covering sidewalls of the ridge stripe portion in the first region and said second current block layer covering sidewalls of the ridge stripe portion in the change region, and the refractive index of the first current block layer is greater than the refractive index of the second current block layer.

* * * * *